United States Patent
Lee

(10) Patent No.: US 6,528,367 B1
(45) Date of Patent: Mar. 4, 2003

(54) SELF-ALIGNED ACTIVE ARRAY ALONG THE LENGTH DIRECTION TO FORM UN-BIASED BURIED STRAP FORMATION FOR SUB-150 NM BEST DRAM DEVICES

(75) Inventor: Brian Lee, Hsinchu (TW)

(73) Assignee: ProMos Technologies, Inc., Hsin-Chu (TW)

( * ) Notice: Subject to any disclaimer, the term of this patent is extended or adjusted under 35 U.S.C. 154(b) by 0 days.

(21) Appl. No.: 10/002,983

(22) Filed: Nov. 30, 2001

(51) Int. Cl.[7] .......................................... H01L 21/8242
(52) U.S. Cl. ........................ 438/253; 438/238; 438/637; 438/399; 257/298
(58) Field of Search ............................... 438/253, 238, 438/239, 241, 254, 258, 259, 262, 267, 275, 299, 396, 397, 243, 692, 637, 147, 246, 783, 386, 597; 257/301, 306, 296, 298

(56) References Cited

U.S. PATENT DOCUMENTS

| | | | |
|---|---|---|---|
| 5,909,044 A | 6/1999 | Chakravarti et al. | 257/301 |
| 5,981,332 A | 11/1999 | Mandelman et al. | 438/246 |
| 5,985,768 A | 11/1999 | Speranza et al. | 438/783 |
| 6,008,104 A | 12/1999 | Schrems | 438/386 |
| 6,037,194 A | 3/2000 | Bronner et al. | 438/147 |
| 6,080,618 A | 6/2000 | Bergner et al. | 438/243 |
| 6,083,787 A | 7/2000 | Lee | 438/243 |
| 6,124,206 A | 9/2000 | Flietner et al. | 438/692 |
| 6,130,145 A | 10/2000 | Ilg et al. | 438/592 |
| 6,136,643 A * | 10/2000 | Jeng et al. | 438/253 |
| 6,140,175 A | 10/2000 | Kleinhenz et al. | 438/243 |
| 6,180,975 B1 | 1/2001 | Radens et al. | 257/306 |
| 6,200,873 B1 | 3/2001 | Schrems et al. | 438/386 |
| 6,204,112 B1 | 3/2001 | Chakravarti et al. | 438/243 |
| 6,211,006 B1 | 4/2001 | Tsai et al. | 438/246 |
| 6,236,079 B1 | 5/2001 | Nitayama et al. | 257/306 |
| 6,291,286 B1 | 9/2001 | Hsiao | 438/238 |
| 6,376,304 B1 * | 4/2002 | Matsuoka et al. | 438/253 |
| 6,448,598 B2 * | 9/2002 | Nagano et al. | 257/296 |
| 6,476,433 B1 * | 11/2002 | Wu et al. | 257/298 |

OTHER PUBLICATIONS

Karzhavin, Shallow Trench Isolation Etch Process for 0.2 um Trench CApacitor DRAM Technology, IEEE 1999, pp. 239–245.*

* cited by examiner

*Primary Examiner*—Long Pham
*Assistant Examiner*—(Vikki) Hoa B. Trinh
(74) *Attorney, Agent, or Firm*—George O. Saile; Stephen B. Ackerman; Rosemary L. S. Pike

(57) ABSTRACT

An improved buried strap method in the fabrication of a DRAM integrated circuit device where the active area is self-aligned to the deep trench in the length direction only is described. An etch stop layer is provided on a substrate. A deep trench is etched into the substrate not covered by the etch stop layer and filled with a silicon layer to form a deep trench capacitor. A polysilicon layer is deposited over the capacitor to form a buried strap. A liner layer is deposited over the etch stop layer and the buried strap having the same material as the etch stop layer. A hard mask material is deposited over the liner layer and etched where it is not covered by a mask wherein etching stops at the liner layer. The liner layer and the etch stop layer are etched away where they are not covered by the hard mask layer to form an etch stop frame. The substrate and the deep trench are etched into where they are exposed by the hard mask and the etch stop frame to form isolation trenches. The isolation trenches are filled with a dielectric layer. Gate electrodes are formed overlying the isolation trenches and the substrate. The substrate is annealed whereby dopants from the buried strap diffuse into the substrate to form a buried strap diffusion wherein the buried strap diffusion connects the deep trench capacitor to one of the gate electrodes to complete the buried strap DT DRAM device.

45 Claims, 10 Drawing Sheets

SELF-ALIGNED ACTIVE ARRAY ALONG THE LENGTH DIRECTION TO FORM UN-BIASED BURIED STRAP FORMATION FOR SUB-150 NM BEST DRAM DEVICES

RELATED U.S. PATENT APPLICATION

U.S. patent application Ser. No. 09/898,125 (PR-90-009) filed to Brian Lee on Nov. 5, 2001 now U.S. Pat. No. 6,475,906.

BACKGROUND OF THE INVENTION (1) Field of the Invention

The present invention relates to the fabrication of integrated circuit devices, and more particularly, to a method of fabricating an improved buried strap in deep trench DRAM devices in the fabrication of integrated circuits.

(2) Description of the Prior Art

In the fabrication of integrated circuit devices, a buried strap has been used in fabricating deep trench (DT)-based dynamic random access memory (DRAM) devices. The buried strap is a crucial part of the integration step connecting a storage node capacitor to an array switching transistor by forming a diffusion junction. Therefore, control of diffusion length and resistivity of the buried strap are key issues for a healthy interconnect between array devices and capacitors. The diffusion length varies with buried strap width which is subject to active area-deep trench overlay. To control the buried strap diffusion, thus controlling the junction connection between the transistor and the storage node, the buried strap width needs to be controlled regardless of active area—deep trench misalignment. A fully self-aligned process along the active area width makes the device subject to a short between the active area and the deep trench feature along the active area width direction.

A number of patents have addressed aspects of DRAM fabrication. U.S. Pat. No. 6,211,006 to Tsai et al shows a trench-type capacitor. U.S. Pat. No. 6,124,206 to Flietner et al and U.S. Pat. No. 6,291,286 to Hsiao teach forming deep trench capacitors. U.S. Pat. No. 6,080,618 to Bergner et al discloses formation of a buried strap with little thickness variation. U.S. Pat. No. 6,037,194 to Bronner et al and U.S. Pat. No. 6,083,787 to Lee show deep trench DRAM's and buried straps. U.S. Pat. No. 6,236,079 to Nitayama et al and U.S. Pat. No. 6,294,112 to Chakravarti et al show memory cells with deep trench capacitors. U.S. Pat. No. 5,985,768 to Speranza et al teaches a DRAM device. U.S. Pat. No. 6,008,104 to Schrems, U.S. Pat. No. 6,200,873 to Schrems et al, U.S. Pat. No. 6,140,175 to Kleinhenz et al, U.S. Pat. No. 6,130,145 to Ilg et al, U.S. Pat. No. 5,981,332 to Mandelman et al, U.S. Pat. No. 6,180,975 to Radens et al, and U.S. Pat. Nos. 6,204,112 and 5,909,044 both to Chakravarti et al all show BEST DRAM processes.

SUMMARY OF THE INVENTION

Accordingly, it is a primary object of the present invention to provide an effective and very manufacturable method of BEST DRAM formation in the fabrication of integrated circuits.

It is a further object of the invention to provide a method of forming an improved buried strap in DRAM device fabrication.

A still further object of the invention is to provide a method of forming an improved buried strap in DRAM device fabrication where the active area is self-aligned to the deep trench only in the active area length direction.

Another object of the invention is to provide an improved buried strap formation method where the active area is self-aligned to the deep trench only in the active area length direction using a differential mask open scheme and a low selective silicon etch scheme with a thicker silicon nitride frame.

Yet another object of the invention is to provide an improved buried strap formation method using a selective hemispherical grain (HSG) and plasma doping method along with a differential etch with a silicon nitride frame.

A further object of the invention is to provide an improved buried strap formation method having a ground rule of less than or equal to 0.25 μm in the fabrication of a DRAM integrated circuit device.

In accordance with the objects of the invention, an improved buried strap method in the fabrication of a DRAM integrated circuit device where the active area is self-aligned to the deep trench in the length direction only is achieved. An etch stop layer is provided on a substrate. A deep trench is etched into the substrate not covered by the etch stop layer. A capacitor and a buried strap are formed within the deep trench. A liner layer is deposited overlying the etch stop layer and the buried strap wherein the liner layer is of the same material as the etch stop layer. A hard mask material is deposited overlying the liner layer. The hard mask layer is etched where it is not covered by a mask wherein etching stops at the liner layer. The liner layer and the etch stop layer are etched away where they are not covered by the hard mask layer to form an etch stop frame. The substrate and the deep trench are etched into where they are exposed by the hard mask and the etch stop frame to form isolation trenches. The hard mask layer is removed and the isolation trenches are filled with a dielectric layer. The liner layer and the etch stop layer are removed. Gate electrodes are formed overlying the isolation trenches and the substrate. The substrate is annealed whereby dopants from the buried strap diffuse into the substrate to form a buried strap diffusion wherein the buried strap diffusion connects the deep trench capacitor to one of the gate electrodes to complete the buried strap deep trench DRAM device.

Also in accordance with the objects of the invention, an improved buried strap method in the fabrication of a DRAM integrated circuit device where the active area is self-aligned to the deep trench in the length direction only is achieved. An etch stop layer is provided on a substrate. A deep trench is etched into the substrate not covered by the etch stop layer. The etch stop layer is removed leaving behind a pad silicon nitride layer. A collar oxide is formed on top of the deep trench to isolate a storage capacitor with adjacent capacitors. A buried plate doping and a node dielectric layer formation are performed sequentially. The deep trench is filled with a silicon layer wherein the silicon layer forms an electrode of the deep trench capacitor. The silicon layer is recessed below a top surface of the substrate to leave a recess. A doped polysilicon layer is deposited into the recess to form a buried strap. A liner layer is deposited overlying the pad silicon nitride layer and the buried strap wherein the liner layer may be the same material as the pad nitride layer. A hard mask material is deposited overlying the liner layer. The hard mask layer is etched where it is not covered by a mask wherein etching stops at the liner layer. The liner layer and the etch stop layer are etched away where they are not covered by the hard mask layer to form an etch stop frame. The substrate and the deep trench are etched into where they are exposed by the hard mask and the etch stop frame to form isolation trenches. The hard mask layer is removed and the isolation trenches are filled with a dielectric layer. The liner layer and the etch stop layer are removed. Gate electrodes are formed overlying the isolation trenches and the substrate. The substrate is annealed whereby dopants from the buried strap diffuse into the substrate to form a buried strap diffusion wherein the buried strap diffusion connects the deep trench capacitor to one of the gate electrodes to complete the buried strap deep trench DRAM device.

BRIEF DESCRIPTION OF THE DRAWINGS

In the accompanying drawings forming a material part of this description, there is shown.

DESCRIPTION OF THE PREFERRED EMBODIMENTS

The process of the present invention provides an improved buried strap formation method in the fabrication of DRAM integrated circuit devices. In this invention, the possibility of a short between the active area and the deep trench is avoided by self-aligning the active area and the deep trench in the active area length direction only. In this invention, a thick silicon nitride liner is deposited after buried strap formation. This liner will help to form a template window while not blocking etching along the active area width direction.

Figure 1:
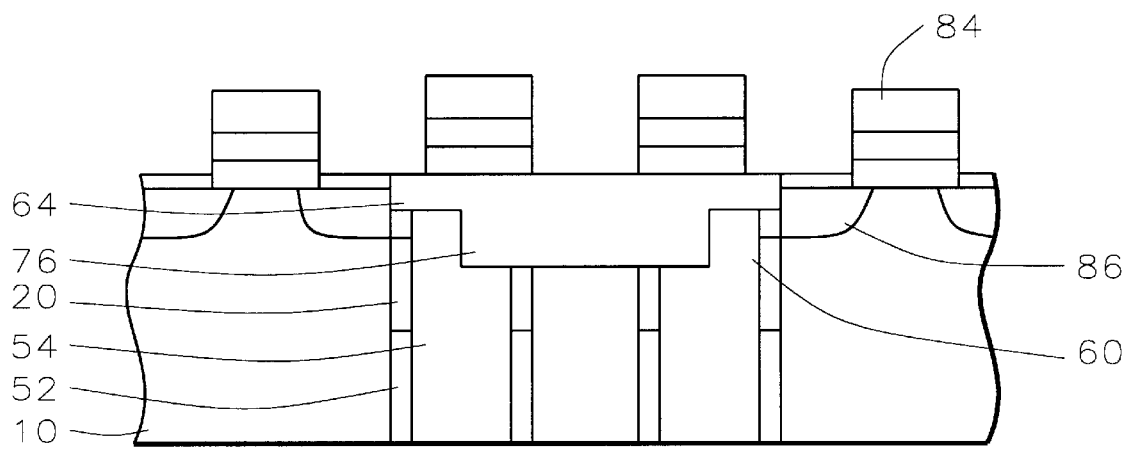
FIG. 1 is a cross-sectional representation of a preferred embodiment of the BEST DRAM device of the present invention.
Figure 2:
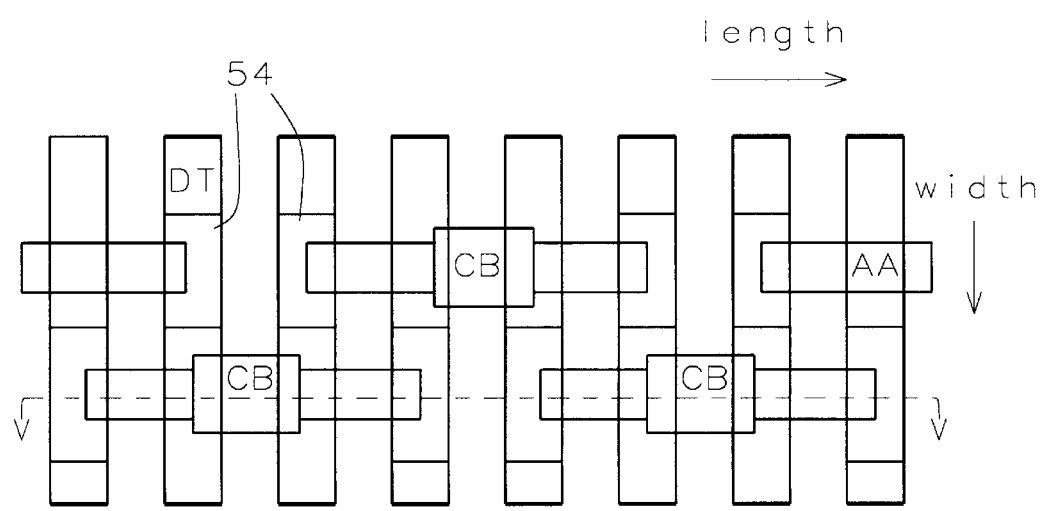
FIG. 2 is a top view of a preferred embodiment of the BEST DRAM device of the present invention.

Referring now more particularly to FIG. 1, there is shown a semiconductor substrate 10. Deep trench capacitor 54 has been formed partially underlying shallow trench isolation 76. Buried strap 60 forms diffusion junction 86. Gate electrodes 84 shown. FIG. 2 shows a top view of the BEST DRAM of the present invention. The active area length and width direction are illustrated. FIG. 1 illustrates view 1—1 of FIG. 2.

Figure 3:
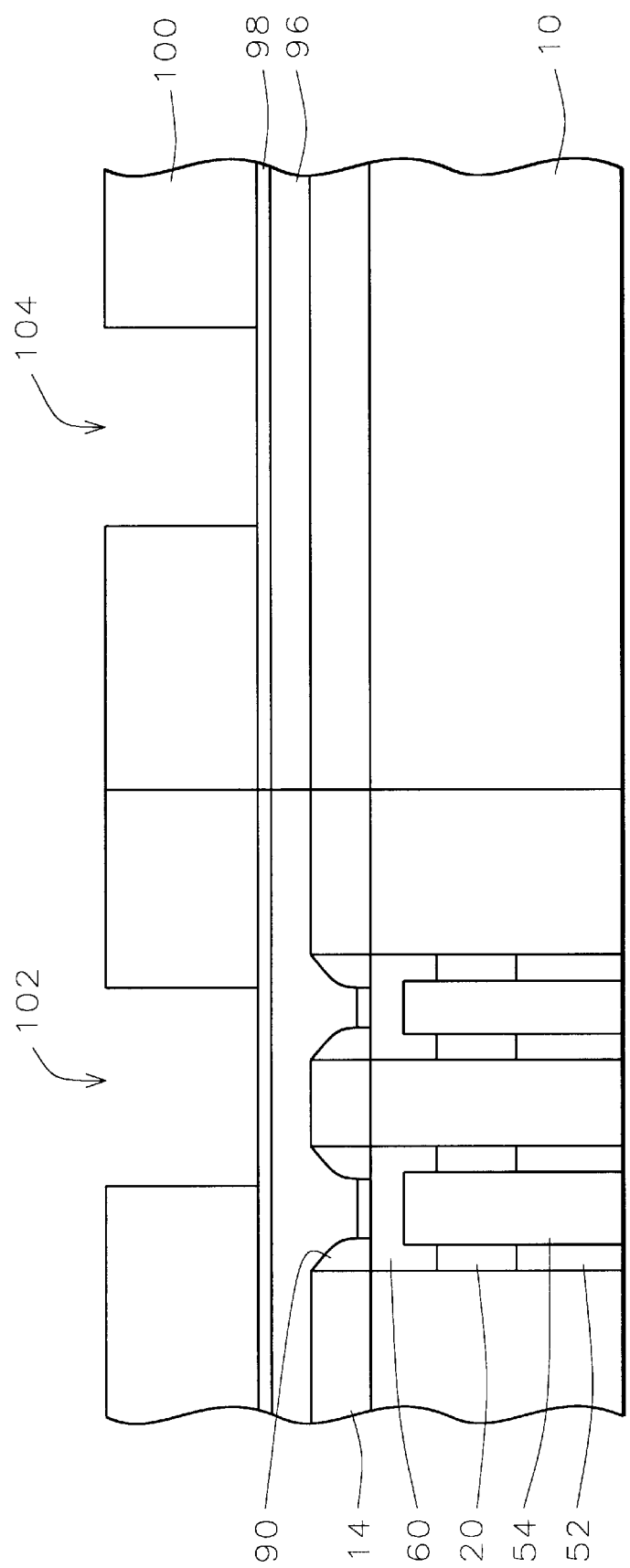
FIGS. 3 through 6 and 9 through 13 are cross-sectional representations of a preferred embodiment of the present invention.

Referring now to FIGS. 3 through 13, the process of the invention to fabricate the BEST DRAM will be described. Referring now more particularly to FIG. 3, there is shown a portion of a semiconductor substrate 10. A pad silicon nitride layer 14 has been formed over the substrate. The silicon nitride layer has a thickness of between about 30 and 50 nm. A thick oxide mask (not shown) is deposited over the pad silicon nitride layer. The thick oxide mask is used as a hard mask for etching deep trenches into the substrate. A deep trench mask is formed by conventional photolithography techniques.

The deep trenches are filled with a sacrificial layer which is recessed to remain only in the lower portion of the deep trenches. Then a dielectric collar layer 20 is conformally deposited in the upper portion of the deep trenches, and the bottom part of the collar oxide is removed by a directional oxide etch, using reactive ion etching (RIE), for example. The sacrificial layer is removed, leaving the collar 20 on the sidewalls of the deep trenches. A buried plate doping, not shown, is performed into the silicon around the trench. A capacitor dielectric layer 52 is grown or deposited within the lower portion of the deep trenches.

Then a silicon layer 54 is deposited within the deep trenches and planarized to the silicon nitride layer, as shown in FIG. 3. The silicon layer 54 may be polysilicon, or preferably amorphous silicon. The silicon 54 may be doped in-situ or implanted, preferably using plasma doping. The amorphous silicon layer 54 within the trenches is recessed (recess 2) by either an RIE or a chemical downstream etch (CDE) process. The recess depth can be optimized to provide the optimal buried strap thickness. The recess should be between about 100 and 150 nm from the top silicon nitride surface, but not more than 200 nm.

The collar 20 is etched using a wet process to form a collar divot of between about 30 and 50 nm below the recess 2 depth. Now, a buried strap layer 60 is formed overlying the silicon layer 54. Preferably, the selective HSG polysilicon formation of co-pending U.S. patent application Ser. No. 09/898,125 (PR-90-009), herein incorporated by reference, is used to form the buried strap 60. The doped polysilicon layer is deposited into the recess to form the buried strap. The buried strap thickness should not exceed the recess 2 depth, thus providing sufficient space to be filled by oxide in a later STI oxide deposition step.

Now, a thick silicon nitride liner layer is deposited over the pad silicon nitride layer 14 and the buried strap 60. Preferably, the thick silicon nitride layer has a thickness of between about 30 and 50 nm, depending on the gate types to be formed, planar or vertical. The thick silicon nitride layer may be anisotropically etched back to leave silicon nitride spacers 90 on the deep trench inner sidewalls as shown in FIG. 3. The silicon nitride layer 14 and spacers 90 form a template window or frame.

A hard mask material such as borosilicate glass (BSG) or borophosphosilicate glass (BPSG), for example, 96 is deposited over the thick silicon nitride layer or spacers 90. This material must be selective to both silicon nitride and polysilicon and also wet strippable selective to thermal oxide. The hard mask thickness is chosen such that it provides planarization without forming a divot over the deep trenches and provides sufficient masking during oxide and main silicon etch steps. The hard mask thickness should range from between about 150 to 300 nm, depending on the post-silicon nitride etch step.

An anti-reflective coating layer 98, preferably organic, is coated over the hard mask layer and a photoresist mask 100 is formed having openings 102 in the array area and 104 in the support area. The openings in the mask are for shallow trench isolation areas to be formed. The thick silicon nitride layer 90 also will enhance the deep trench—active area alignment mark during photolithography by double reflection off the multiple underlying layers.

Figure 4:
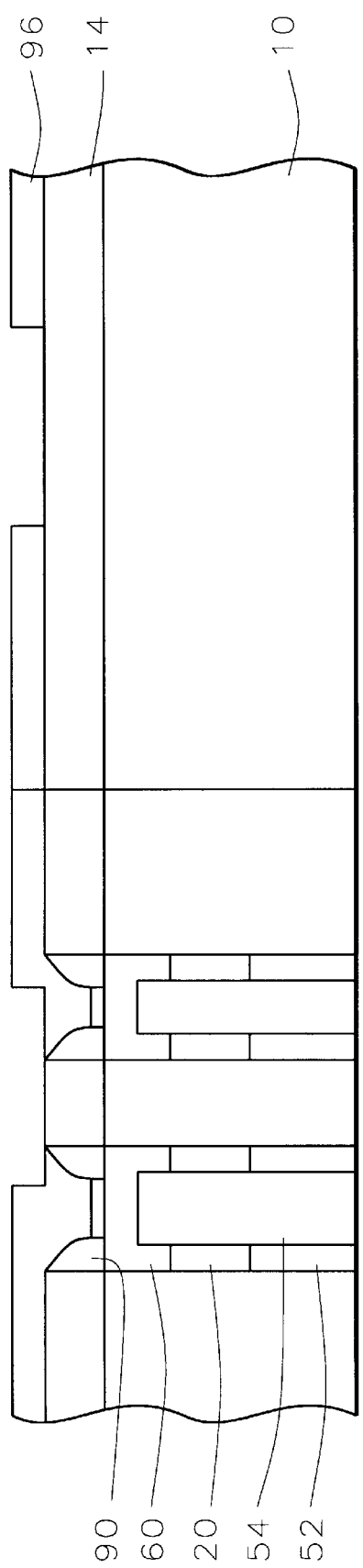

Referring now to FIG. 4, the ARC layer 98 and the BSG hard mask 96 are etched where they are not covered by the photoresist mask. This is preferably a plasma etch with an appropriate selectivity of BSG with respect to photoresist of more than 3:1 and with respect to silicon nitride of more than 4:1, thus stopping on top of the silicon nitride layer in both the array area and the support area. $C_4F_8$ and $C_5F_8$ gas chemistries along with CO, Ar, and $O_2$ gas mixtures are desirable for this oxide etch step. The etch will stop at the silicon nitride liner layer 90.

Figure 5:
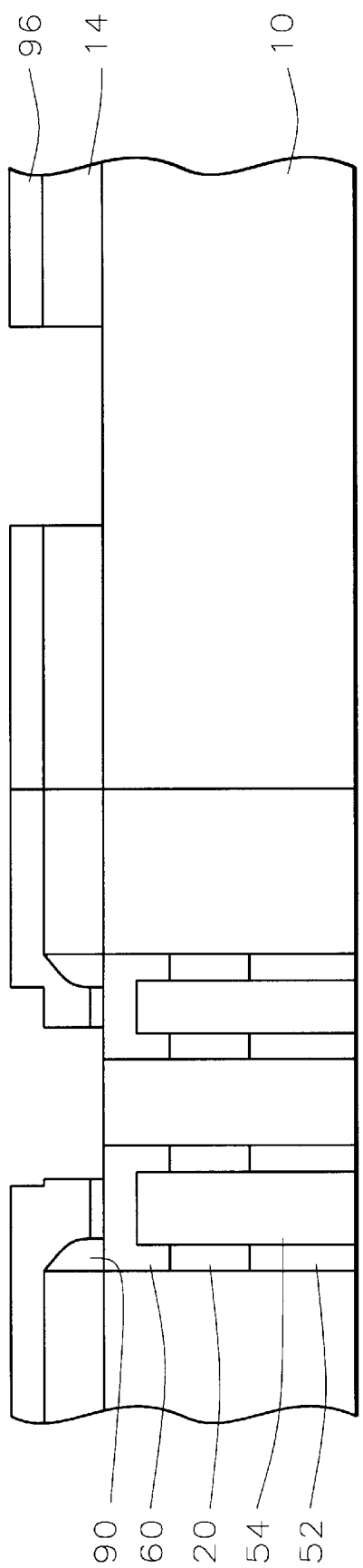

The photoresist mask and the ARC layer are stripped in-situ or in a separate strip tool, as shown in FIG. 4. Now, the silicon nitride etch step is performed. The silicon nitride layers 90, 88, and 14 exposed within the hard mask openings are etched away leaving behind an etch template window which is not so much influenced by the photoresist opening size. This is a so-called self-aligned etch. It is crucial that the silicon nitride etch process is selective with respect to oxide because the BSG oxide will serve as a hard mask for the later post-silicon nitride etch step; that is, the silicon etch step. It is desirable to maintain the selectivity of silicon nitride to oxide at greater than 2.5:1. A hydrogen-containing carbofluoride chemistry, such as $CHF_3$, $CH_3F$, or $CH_2F_2$, is suitable in a mixture with other gases such as CO, Ar, and $O_2$. The results of the silicon nitride etch are illustrated in FIG. 5. Note that although the opening in the BSG layer was off-center due to mask misalignment, the opening made in the silicon nitride frame is centered between the two deep trenches.

Figure 6:
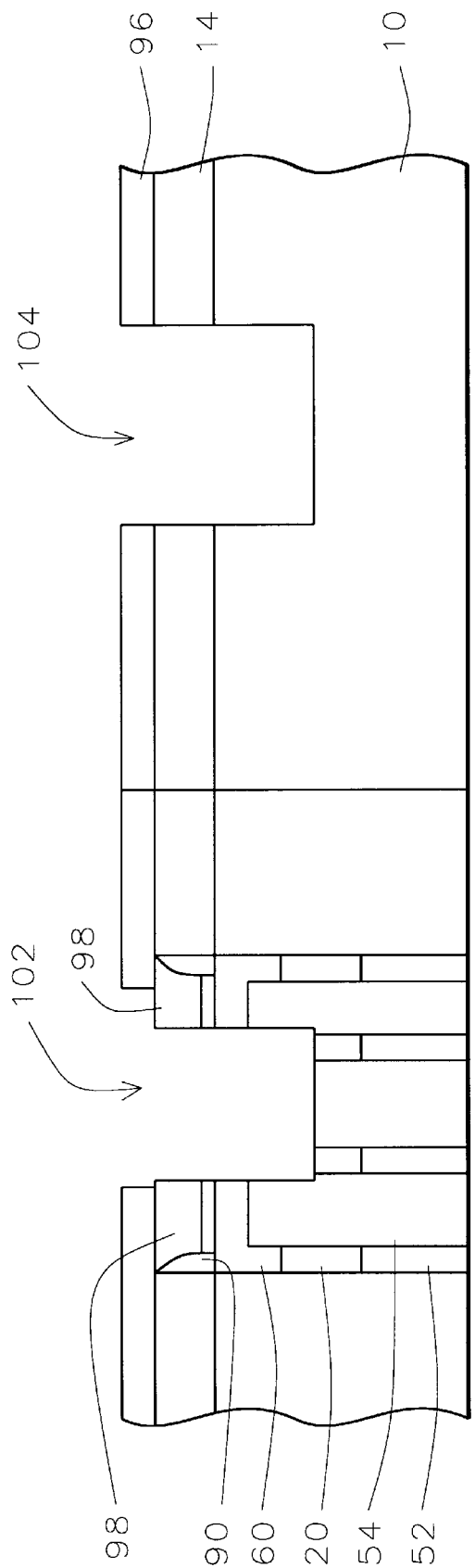

Now, as shown in FIG. 6, the silicon is etched where it is exposed by the silicon nitride template window. In the support area, the silicon substrate is etched into to a depth of greater than about 250 nm. In the array area, the trench is etched through portions of the buried strap 60, deep trenches 54, and collar 20 as well as the silicon substrate 10. This etching may be performed in a separate chamber from the previous etching or in the same chamber. The overall selectivity of silicon with respect to oxide is controlled to be between about 1.5:1 and 2:1. In the case of a high selectivity of silicon to oxide (more than 1.5:1), a portion of the collar oxide 20 may remain protruding into the trench 102. This residue can be removed by a selective oxide etch in-situ or by a wet process. A multiple etch and sputter process can also be employed to achieve controlled silicon to oxide etch selectivity. It is crucial to control the etch selectivity of silicon to oxide to not exceed 2:1. If the selectivity exceeds 2:1, a fully self-aligned feature will be formed causing a short along the active area width direction.

During this integrated etch step, the BSG pedestal 98 formed next to the silicon nitride frame within the deep trenches serves as a hard mask during the silicon etch. Thus, it is important to keep the pedestal height thick enough to be preserved during the whole silicon etch either by starting with a thicker BSG layer or by increasing the etch selectivity.

Figure 7:
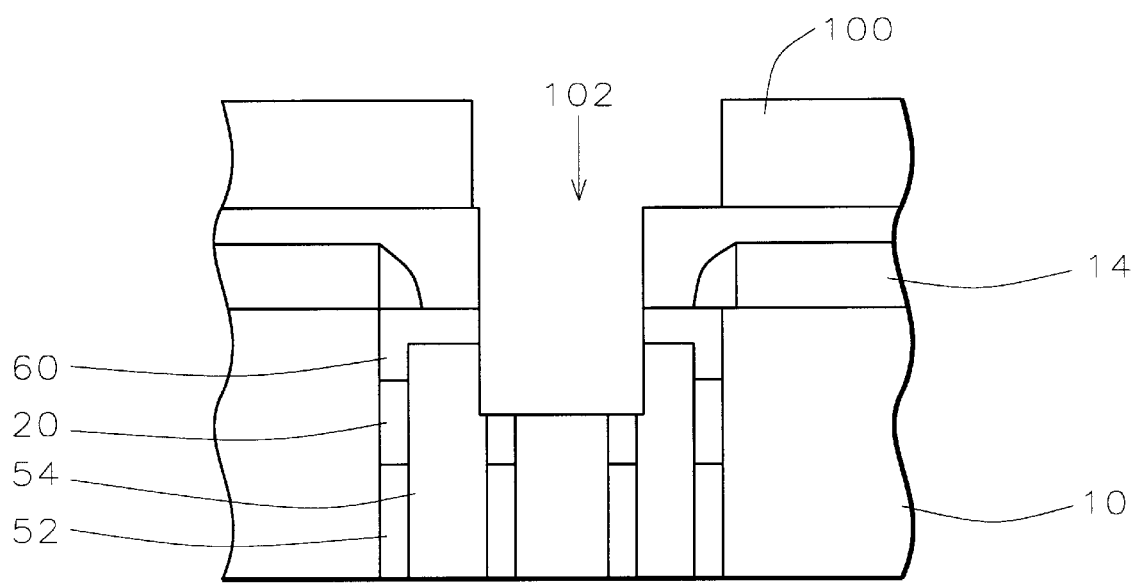
FIG. 7 is a cross-sectional representation of the self-aligned shallow trench of the present invention.
Figure 8:
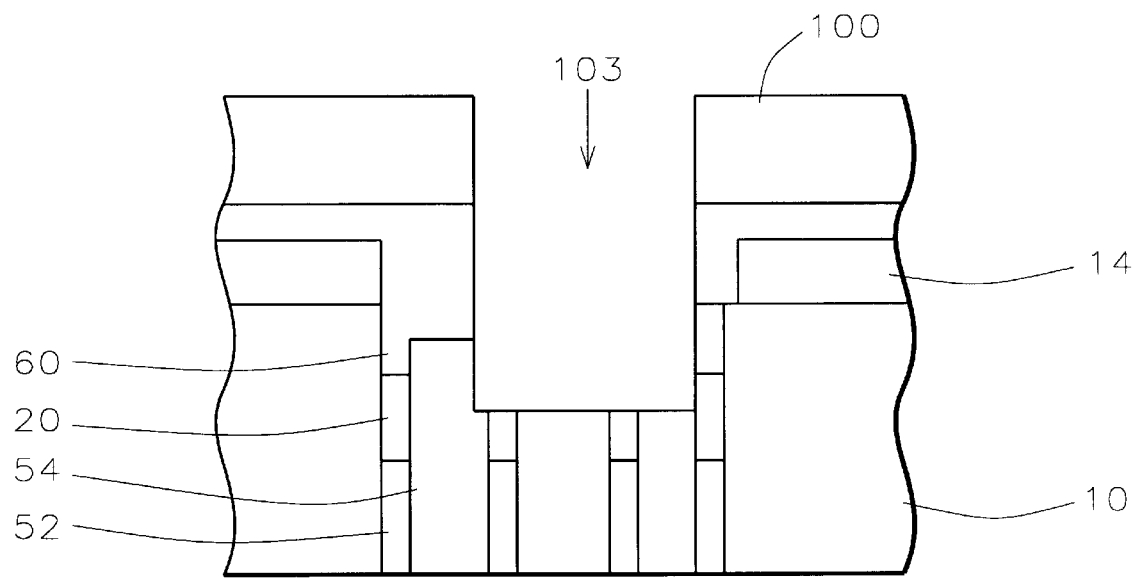
FIG. 8 is a cross-sectional representation of a problem solved by the present invention.

FIG. 7 shows the resulting trench 102 with an overlay of the mask 100. This figure shows that using the self-aligned scheme of the present invention results in a centered trench 102 even though the mask 100 is misaligned. FIG. 8 shows the trench 103 resulting from a conventional non-self-aligned scheme. The trench 103 is etched into the silicon where the silicon is not covered by the mask 100. Since the mask 100 is misaligned, the trench 103 also is misaligned.

It is important to design the active array length and spacing between the active areas along the length direction such that there is enough coverage over the silicon nitride frame under the photoresist so that the active area mask will cover the buried strap portion during the etching process.

Figure 9:
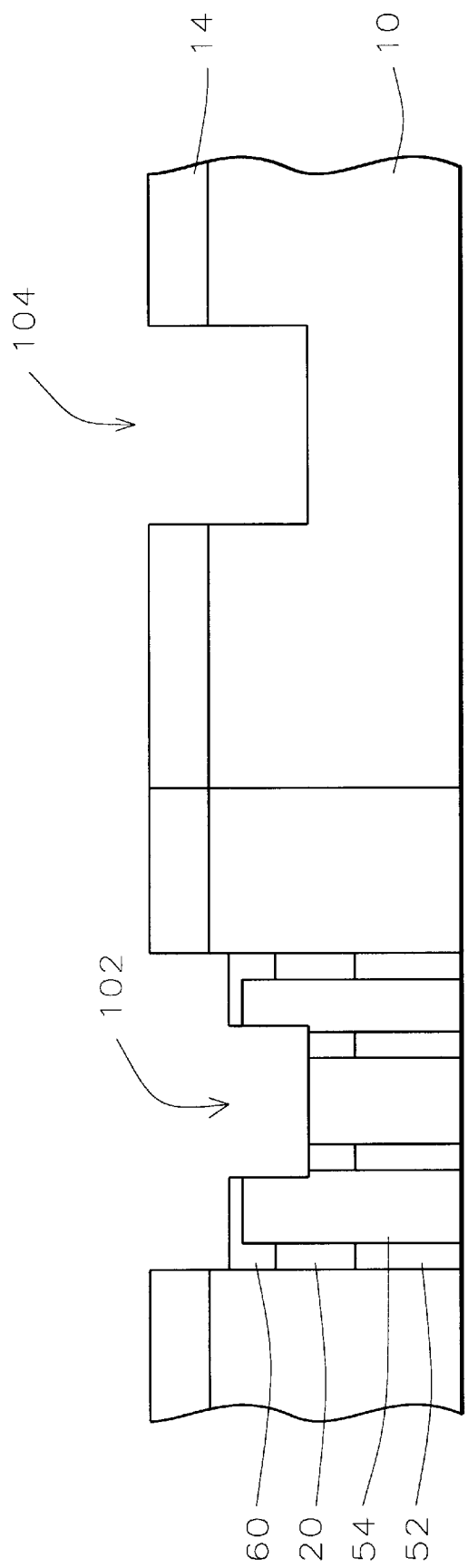

Referring now to FIG. 9, the BSG hard mask 96 is removed by a wet etch selective to silicon and to thermal oxide; i.e. the collar oxide 20. The silicon nitride frame is pulled back by another wet process to remove the silicon nitride overlying the deep trenches, as shown in FIG. 9.

Figure 10:
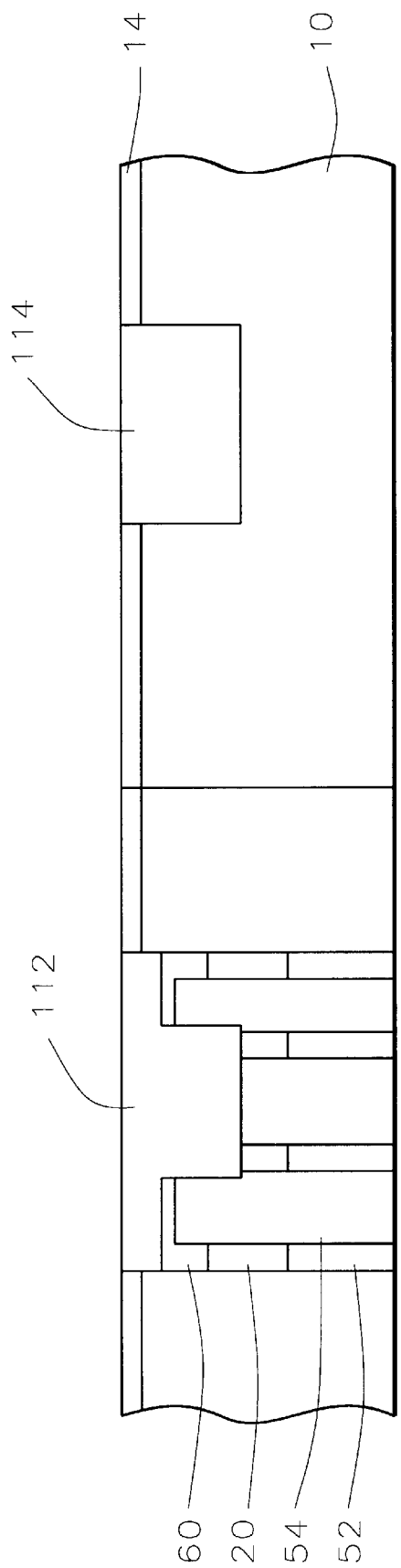

Processing continues as is conventional in the art. As illustrated in FIG. 10, the trenches 102 and 104 are filled with a dielectric layer such as oxide to form shallow trench isolation (STI) regions 112 and 114. For example, the STI regions are filled with an oxide using a high density plasma chemical vapor deposition (HDP-CVD) process. The oxide is planarized, for example, by chemical mechanical polishing (CMP) to complete the STI regions, as illustrated in FIG. 10.

Figure 11:
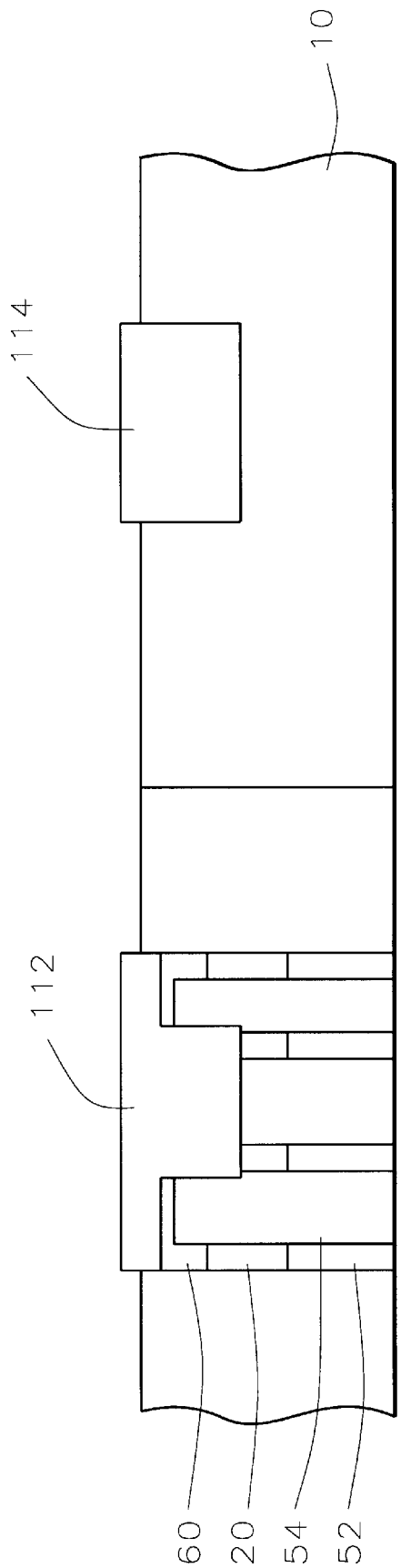
Figure 12:
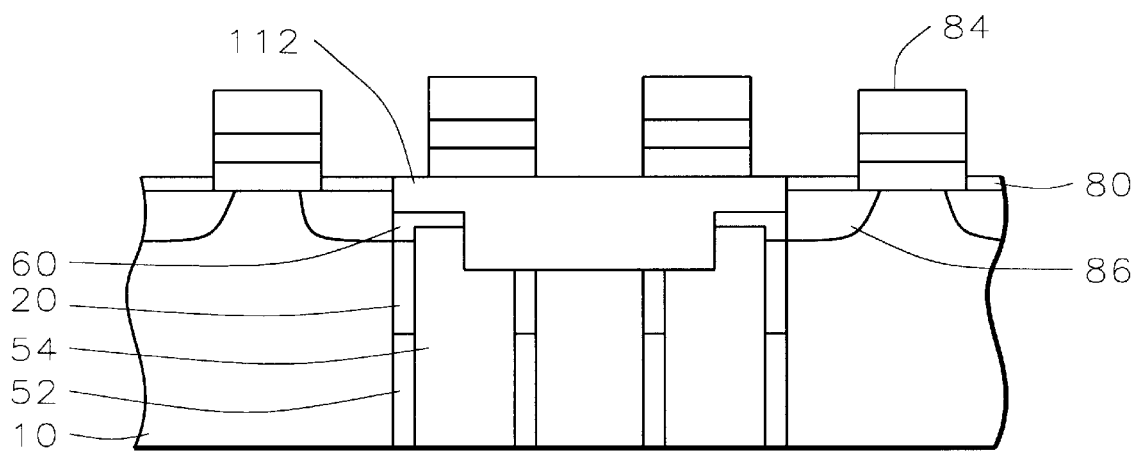

Now, the silicon nitride layer 14 is removed by a wet etching method, for example, as shown in FIG. 11. Now, a gate oxide layer 80 is grown on the substrate surface in the active area, as shown in FIG. 12. Gate electrodes 84 are formed as is conventional in the art. Buried strap diffusion junction 86 is formed by outdiffusion from the buried strap 60 during thermal processes. The diffusion junction 86 provides a connection between the deep trench capacitor 54 and the transistor 84. This completes the BEST DRAM device. The differential etch process with silicon nitride frame is insensitive to misalignment of the active area mask to the deep trench area.

Figure 13:
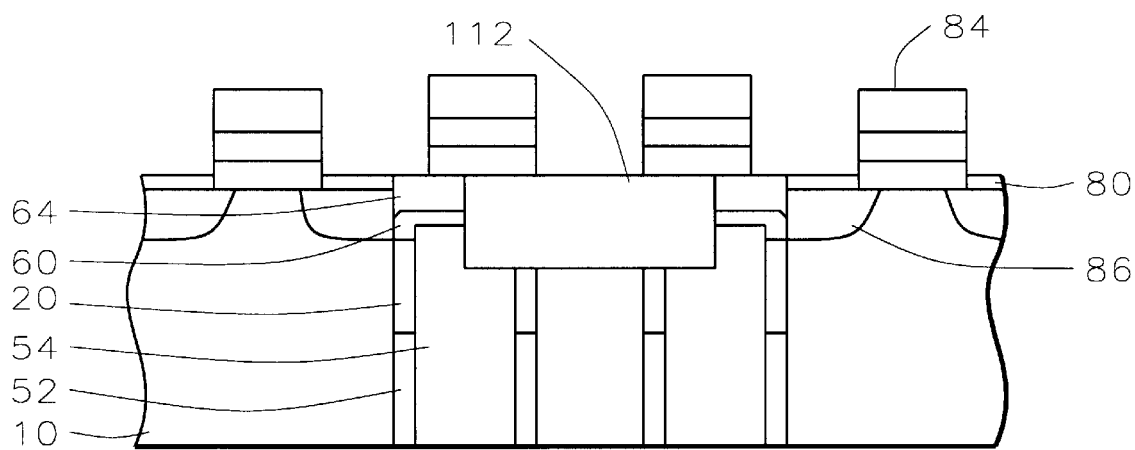

FIG. 13 illustrates a completed BEST DRAM device where the HSG buried strap 60 with overlying silicon nitride capping layer 64 of co-pending U.S. patent application Ser. No. 09/898,125 (PR-90-009), herein incorporated by reference, is used along with the differential etch process with silicon nitride frame of the present invention. This process is likewise insensitive to mask misalignment.

The process of the present invention provides a differential etch with a silicon nitride frame to avoid misalignment problems between the active area and the deep trench. A shallow trench isolation region is formed in a self-aligned manner to the active area in the length direction only.

While the invention has been particularly shown and described with reference to the preferred embodiments thereof, it will be understood by those skilled in the art that various changes in form and details may be made without departing from the spirit and scope of the invention.

What is claimed is:

1. A method of fabricating shallow trench isolation in the manufacture of a buried strap deep trench DRAM integrated circuit device comprising:

providing an etch stop layer on a substrate and patterning said etch stop layer;

etching a deep trench into said substrate not covered by said etch stop layer;

forming a capacitor and said buried strap within said deep trench;

depositing a liner layer overlying said etch stop layer and said buried strap wherein said liner layer is the same material as said etch stop layer;

depositing a hard mask material overlying said liner layer;

patterning said hard mask layer to provide openings for shallow trenches wherein said liner layer acts as an etch stop during said patterning;

etching away said liner layer and said etch stop layer where they are not covered by said hard mask layer to provide a self-aligned etch stop frame in a length direction of an active area overlying said buried strap;

thereafter etching into said substrate and said deep trench where they are exposed by said hard mask and said etch stop frame to form isolation trenches;

thereafter removing said hard mask layer; and filling said isolation trenches with a dielectric layer to complete said shallow trench isolation in said buried strap deep trench DRAM device.

2. The method according to claim 1 wherein said etch stop layer comprises silicon nitride having a thickness of between about 100 and 200 nm.

3. The method according to claim 1 wherein said step of forming a capacitor and said buried strap within said deep trench comprises:

filling said deep trench with a silicon layer wherein said silicon layer forms a deep trench capacitor;

recessing said silicon layer below a top surface of said substrate to leave a recess; and depositing a polysilicon layer into said recess to form said buried strap.

4. The method according to claim 3 wherein said silicon layer comprises amorphous silicon.

5. The method according to claim 3 wherein said recess has a depth of not more than 200 nm.

6. The method according to claim 3 wherein said polysilicon layer is formed by selectively depositing a hemispherical grain polysilicon layer to a thickness of between about 20 and 100 nm and having a grain size of between about 10 and 50 nm.

7. The method according to claim 6 before said step of selectively depositing a hemispherical grain polysilicon layer further comprising plasma doping a silicon layer forming said capacitor to amorphize a surface of said silicon layer.

8. The method according to claim 6 wherein said step of selectively depositing a hemispherical grain polysilicon layer comprises in-situ doping of said polysilicon layer.

9. The method according to claim 3 wherein said polysilicon layer is doped to a concentration of between about $10^{18}$ and $10^{21}$ ions/cm$^3$.

10. The method according to claim 3 wherein said polysilicon layer is doped by one of the group containing: plasma doping, plasma ion immersion implantation, and gas phase doping.

11. The method according to claim 1 wherein said liner layer comprises silicon nitride having a thickness of between about 30 and 50 nm.

12. The method according to claim 1 wherein said hard mask layer comprises one of the group containing borosilicate glass (BSG) and borophosphosilicate glass (BPSG) having a thickness of between about 150 and 350 nm.

13. The method according to claim 1 wherein said step of etching away said hard mask layer comprises a plasma etch having a selectivity of said hard mask material with respect to photoresist of more than 3 to 1 and having a selectivity of said hard mask material to said etch stop material of more than 4 to 1.

14. The method according to claim 1 wherein said step of etching away said hard mask layer comprises a plasma etch comprising a hydrogen-containing carbofluoride chemistry.

15. The method according to claim 1 wherein said step of etching away said liner layer and said etch stop layer has a selectivity of said liner layer material with respect to said hard mask material of between about 2:1 and 3:1.

16. The method according to claim 1 after said step of filling said isolation trenches further comprising:

removing said liner layer and said etch stop layer;

forming gate electrodes overlying said isolation trenches and said substrate; and annealing said substrate whereby dopants from said buried strap diffuse into said substrate to form a buried strap diffusion and wherein said buried strap diffusion connects said deep trench capacitor to one of said gate electrodes to complete said buried strap deep trench DRAM device.

17. A method of fabricating shallow trench isolation in the manufacture of a buried strap deep trench DRAM integrated circuit device comprising:

providing an etch stop layer on a substrate and patterning said etch stop layer;

etching a deep trench into said substrate not covered by said etch stop layer;

forming a capacitor and said buried strap within said deep trench;

depositing a liner layer overlying said etch stop layer and said buried strap wherein said liner layer is the same material as said etch stop layer;

depositing a hard mask material overlying said liner layer;

patterning said hard mask layer to provide openings for shallow trenches wherein said liner layer acts as an etch stop during said patterning;

etching away said liner layer and said etch stop layer where they are not covered by said hard mask layer to provide a self-aligned etch stop frame in a length direction of an active area overlying said buried strap;

thereafter etching into said substrate and said deep trench where they are exposed by said hard mask and said etch stop frame to form isolation trenches;

thereafter removing said hard mask layer; and filling said isolation trenches with a dielectric layer;

removing said liner layer and said etch stop layer;

forming gate electrodes overlying said isolation trenches and said substrate; and annealing said substrate whereby dopants from said buried strap diffuse into said substrate to form a buried strap diffusion and wherein said buried strap diffusion connects said deep trench capacitor to one of said gate electrodes to complete said buried strap deep trench DRAM device.

18. The method according to claim 17 wherein said etch stop layer comprises silicon nitride having a thickness of between about 100 and 200 nm.

19. The method according to claim 17 wherein said step of forming a capacitor and said buried strap within said deep trench comprises:

filling said deep trench with a silicon layer wherein said silicon layer forms a deep trench capacitor;

recessing said silicon layer below a top surface of said substrate to leave a recess; and depositing a polysilicon layer into said recess to form said buried strap.

20. The method according to claim 19 wherein said silicon layer comprises amorphous silicon.

21. The method according to claim 19 wherein said recess has a depth of not more than 200 nm.

22. The method according to claim 19 wherein said polysilicon layer is formed by selectively depositing a hemispherical grain polysilicon layer to a thickness of between about 20 and 100 nm and having a grain size of between about 10 and 50 nm.

23. The method according to claim 22 before said step of selectively depositing a hemispherical grain polysilicon layer further comprising plasma doping a silicon layer forming said capacitor to amorphize a surface of said silicon layer.

24. The method according to claim 22 wherein said step of selectively depositing a hemispherical grain polysilicon layer comprises in-situ doping of said polysilicon layer.

25. The method according to claim 19 wherein said polysilicon layer is doped to a concentration of between about $10^{18}$ and $10^{21}$ ions/cm$^3$.

26. The method according to claim 19 wherein said polysilicon layer is doped by one of the group containing: plasma doping, plasma ion immersion implantation, and gas phase doping.

27. The method according to claim 17 wherein said liner layer comprises silicon-nitride having a thickness of between about 30 and 50 nm.

28. The method according to claim 17 wherein said hard mask layer comprises one of the group containing borosilicate glass (BSG) and borophosphosilicate glass (BPSG) having a thickness of between about 150 and 350 nm.

29. The method according to claim 17 wherein said step of etching away said hard mask layer comprises a plasma etch having a selectivity of said hard mask material with respect to photoresist of more than 3 to 1 and having a selectivity of said hard mask material to said etch stop material of more than 4 to 1.

30. The method according to claim 17 wherein said step of etching away said hard mask layer comprises a plasma etch comprising a hydrogen-containing carbofluoride chemistry.

31. The method according to claim 17 wherein said step of etching away said liner layer and said etch stop layer has a selectivity of said liner layer material with respect to said hard mask material of between about 2:1 and 3:1.

32. A method of fabricating a buried strap deep trench DRAM integrated circuit device comprising:

providing an etch stop layer on a substrate and patterning said etch stop layer;

etching a deep trench into said substrate not covered by said etch stop layer;

filling said deep trench with a silicon layer wherein said silicon layer forms a deep trench capacitor;

recessing said silicon layer below a top surface of said substrate to leave a recess;

selectively depositing a hemispherical grain polysilicon layer into said recess to form said buried strap;

depositing a liner layer overlying said etch stop layer and said buried strap wherein said liner layer is the same material as said etch stop layer;

depositing a hard mask material overlying said liner layer;

etching away said hard mask layer where it is not covered by a mask wherein said etching stops at said liner layer;

etching away said liner layer and said etch stop layer where they are not covered by said hard mask layer;

thereafter etching into said substrate and said deep trench where they are exposed after removing said liner layer and said etch stop layer to form isolation trenches;

thereafter removing said hard mask layer;

filling said isolation trenches with a dielectric layer;

removing said liner layer and said etch stop layer;

forming gate electrodes overlying said isolation trenches and said substrate; and annealing said substrate whereby dopants from said buried strap diffuse into said substrate to form a buried strap diffusion and wherein said buried strap diffusion connects said deep trench capacitor to one of said gate electrodes to complete said buried strap deep trench DRAM device.

33. The method according to claim 32 wherein said etch stop layer comprises silicon nitride having a thickness of between about 100 and 200 nm.

34. The method according to claim 32 wherein said silicon layer comprises amorphous silicon.

35. The method according to claim 32 wherein said recess has a depth of not more than 200 nm.

36. The method according to claim 32 wherein said step of selectively depositing said hemispherical grain polysilicon layer comprises depositing said polysilicon layer to a thickness of between about 20 and 100 nm and having a grain size of between about 10 and 50 nm.

37. The method according to claim 32 before said step of selectively depositing said hemispherical grain polysilicon layer further comprising plasma doping said silicon layer to amorphize a surface of said silicon layer.

38. The method according to claim 32 wherein said step of selectively depositing said hemispherical grain polysilicon layer comprises in-situ doping of said polysilicon layer.

39. The method according to claim 32 wherein said polysilicon layer is doped to a concentration of between about $10^{18}$ and $10^{21}$ ions/cm$^3$.

40. The method according to claim 32 wherein said polysilicon layer is doped by one of the group containing: plasma doping, plasma ion immersion implantation, and gas phase doping.

41. The method according to claim 32 wherein said liner layer comprises silicon nitride having a thickness of between about 30 and 50 nm.

42. The method according to claim 32 wherein said hard mask layer comprises one of the group containing: borosilicate glass (BSG) and borophosphosilicate glass (BPSG) having a thickness of between about 150 and 350 nm.

43. The method according to claim 32 wherein said step of etching away said hard mask layer comprises a plasma etch having a selectivity of said hard mask material with respect to photoresist of more than 3 to 1 and having a selectivity of said hard mask material to said etch stop material of more than 4 to 1.

44. The method according to claim 32 wherein said step of etching away said hard mask layer comprises a plasma etch comprising a hydrogen-containing carbofluoride chemistry.

45. The method according to claim 32 wherein said step of etching away said liner layer and said etch stop layer has a selectivity of said liner layer material with respect to said hard mask material of between about 2:1 and 3:1.

* * * * *